United States Patent [19]

Hayward

[11] Patent Number: 4,800,299
[45] Date of Patent: Jan. 24, 1989

[54] METHOD AND APPARATUS FOR MOSFET RADIATION FAILURE CIRCUMVENTION

[75] Inventor: William C. Hayward, Marina Del Rey, Calif.

[73] Assignee: Northrop Corporation, Hawthorne, Calif.

[21] Appl. No.: 943,976

[22] Filed: Dec. 18, 1986

[51] Int. Cl.$^4$ .............................................. H03K 19/08
[52] U.S. Cl. .................................. 307/308; 307/311; 307/580; 307/570; 357/29
[58] Field of Search ............... 307/300, 311, 580, 570, 307/572; 323/289; 357/29

[56] References Cited

U.S. PATENT DOCUMENTS

| | | | |
|---|---|---|---|
| 3,886,376 | 5/1975 | Bickley et al. | 307/300 |
| 4,011,471 | 3/1977 | Rockett, Jr. | 357/29 |
| 4,225,797 | 9/1980 | Fredrickson | 307/311 |
| 4,590,395 | 5/1986 | O'Connor et al. | 307/280 |

Primary Examiner—John S. Heyman
Assistant Examiner—Nancy Thai
Attorney, Agent, or Firm—Terry J. Anderson; Robert B. Block

[57] ABSTRACT

A method and electrical circuit for circumventing MOSFET failure resulting from exposure to high energy level radiation. The method includes the steps of turning the MOSFET on during the radiation event and keeping the MOSFET on at the end of the event until parasitic elements inherent in the MOSFET have recovered. In one presently preferred embodiment this method is implemented by providing a bipolar transistor across the voltage source of the MOSFET and the MOSFET gate. During exposure to radiation of very high intensity, radiation induced photo currents in the bipolar transistor turn the transistor on, thereby applying an "on enabling" voltage the gate of the MOSFET device to turn on the MOSFET device. The MOSFET, in an "on" state, effectively shorts out the inherent parasitic elements thereby preventing destruction of the parasitic elements and, consequently, the MOSFET. A resistor is provided to keep the MOSFET "on" until the parasitic elements recover.

25 Claims, 2 Drawing Sheets

METHOD AND APPARATUS FOR MOSFET RADIATION FAILURE CIRCUMVENTION

BACKGROUND OF INVENTION

1. Field of Invention

The present invention concerns Metallic Oxide Semiconductor Field Effect Transistor (MOSFET) devices and, more particularly, a method and apparatus for preventing MOSFET device failure resulting from exposure to high energy level radiation.

2. Description of the Prior Art

Electronic devices such as, for example, MOSFETs and bipolar transistors, typically experience a degradation in performance when subjected to various levels of radiation. Repeated exposures to low energy level radiation, for example, can produce cumulative effects which may change the operating characteristics of the device. Repeated exposures to low level radiation can, over a period of time, eventually cause the device to become inoperative or lead to erratic behavior which renders the device useless. Exposure to high energy radiation fluxes (as might be experienced by exposure to a nuclear blast or proximity to a nuclear reactor) typically produce an essentially instantaneous destruction of the device.

A variety of schemes have been devised to avoid radiation failure in bipolar transistor devices. Far less, however, has been accomplished to prevent radiation failure in MOSFET devices. Because of fundamental structural difference between bipolar transistors and MOSFET devices, the various schemes for protecting bipolar devices are not generally applicable to MOSFET devices. What little is known with respect to preventing MOSFET radiation failure is practical only with respect to low energy levels of radiation exposure. No useful schemes are known for protecting MOSFET transistors against high energy radiation exposure.

Two U.S. patents address circumventing radiation failure in MOSFET devices. These are U.S. Pat. Nos. 4,011,471 and 4,313,846. Both of these patents, however, are directed to only stabilizing or correcting the degradation of MOSFET device operating characteristics resulting from cumulative low level radiation exposures. The voltages at which MOSFET devices turn "on" shift as a result of low level radiation exposure. Each of the above patents introduces corrective circuitry to account for a permanent shift and/or time varying drift in this "on" voltage. A further reference, IBM Technical Disclosure Bulletin, Vol. 25 No. 11A, Apr. 1983, also is directed to low level radiation induced "on" voltage shift and/or drift correction.

Aside from the above noted approaches for correcting MOSFET responses to low level radiation flux exposure, there have been two other suggested approaches to protecting MOSFET devices from high energy level radiation fluxes. The first approach entails either limiting or shutting off the voltage source to the MOSFET device during a radiation exposure event to curtail destructive power surges occurring during recovery of the MOSFET after the radiation exposure event. The idea being to simply take the MOSFET out of the circuit during a radiation event. This approach has a number of limitations, however. It is very difficult to ground a MOSFET voltage source during a radiation event since the circuitry needed to effect this grounding is itself subject erratic response during the same radiation event. It is even more difficult to attempt to limit or attenuate a MOSFET voltage source so as to avoid destructive power surges.

The second approach to preventing MOSFET failure from high energy level radiation exposure is to attempt to enhance or modify the fundamental characteristics of the MOSFET device itself so that high energy level radiation exposures cease to destroy the modified MOSFET device. Since this approach typically requires exotic control over the composition and the doping of the MOSFET device substrate and its N or P wells, it is difficult if not impossible to implement this approach without adversely affecting the general operating characteristics of the MOSFET device such as, for example, its threshold "on" voltage and the like.

BRIEF SUMMARY OF THE INVENTION

It is therefore an object of the present invention to provide a method for circumventing radiation failure in a MOSFET device. It is a further object of the present invention to provide a circuit implementing this method which is simple in form, reliable in operation and inexpensive to implement.

These and other goals and objectives are achieved in the present inventive method by turning the MOSFET device on for the duration of a radiation exposure event and for a brief period thereafter while intrinsic parasitic elements within the MOSFET recover from the radiation exposure. In general terms, the present inventive circuit includes a switching device for applying and "on" enabling voltage to the gate of the MOSFET to turn the MOSFET "on" and a timing element for removing the "on" enabling voltage from the MOSFET gate after the MOSFET parasitic elements have recovered from the radiation exposure.

In one embodiment the switching device includes a bipolar transistor having its collector and emitter terminals connected across the voltage source for the MOSFET and the gate of the MOSFET. In this embodiment the timing element includes a resistor connected across the base of the bipolar transistor and the transistor terminal attached to the MOSFET gate. In an alternative embodiment, a voltage source other than the MOSFET voltage source is employed, with the bipolar transistor collector and emitter terminals connected across this alternative voltage source and the MOSFET gate.

The novel features which are believed to be characteristic of the present invention, together with further objectives and advantages thereof, will be better understood from the following detailed description considered in connection with the accompanying drawings, wherein like numbers designate like elements. It should be expressly understood, however, that the drawings are for purposes of illustration and description only and are not intended as a definition of the limits of the invention.

BRIEF DESCRIPTION OF THE DRAWINGS

This invention will be better understood if taken in conjunction with the drawings wherein.

This invention utilizes certain principles and/or concepts as are set forth in the claims appended to this specification. Those skilled in the electrical arts to which this invention pertains will realize that these principles and/or concepts are capable of being utilized in a variety of embodiments which may differ from the exact embodiments set forth for illustrative purposes herein. For these reasons, the invention described in this specification is not to be construed as being limited to only the illustrative embodiments but is only to be construed in view of the appended claims.

DETAIL DESCRIPTION OF THE INVENTION

Insulated gate field effect transistors, i.e., igfets or mos fets, are commonly referred to as MOSFET devices. For the purposes of this specification the terminology MOSFETs, MOSFET devices and MOSFET transistor devices will be used interchangable to refer to these type devices. These devices are constructed by diffusing two "wells" of a first type of doped material into a substrate made of a second type of doped material. In "N" channel devices, the wells are "N" type material and the substrate is a "P" type. IN "P" channel devices the wells are "P" type material and the substrate is "N" type material.

Irrespective of whether the devices are "N" or "P" type devices, one of the wells serves as a "source" for the device and the other well as the "drain" of the device. The devices are constructed having a separation (called a "channel") between the source and the drain. An oxide layer covers the channel between the source and the drain with a gate positioned over the oxide layer. By imposing a voltage on the gate, a field is created over the channel. Movement of majority carries in this field conducts current between the source and the drain.

Figure 1:
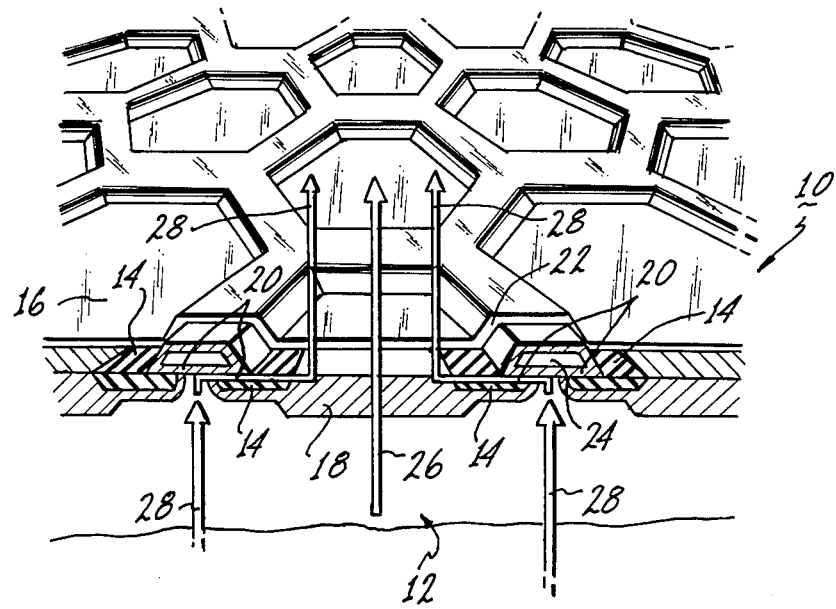
FIG. 1 is perspective elevational view, in partial section, of an illustrative MOSFET device for use with this invention.

For the purposes of this specification, and as an illustrative example only, a power type MOSFET device (called a HEXFET) is shown in FIG. 1. For the purposes of this specification, it will be described as a "n" type HEXFET. It is of course realized that "P" type HEXFETs operate in an analogous manner to "N" "N" type HEXFETs except that the polarity of the circuit connections, including the gate biasing voltage, will be reversed. For brevity of this specification only the "n" type device will be discussed in detail.

The power HEXFET 10 of FIG. 1 is configured as what is often referred to as vertical double diffusion type structure. A drain region 12 is formed of an "N" type material. A source 14, also "N" type material, is laid out in a hexagon shape as is a metallization material 16. Patterns 18 of "P" type material are arranged with respect to the source 14 and drain 12 to provide channels 20 along the top of the upwardly curving edges of patterns 18 of "P" type material.

Overlaying the channels 20 is an insulating oxide structure 22 which surrounds a gate material 24. During normal operation of the HEXFET 10 of FIG. 1, in an enhancement mode, when a biasing voltage equal to or greater than the on biasing voltage is imposed on the gate 24, majority carriers carry current between the source 14 and the drain 12. For the "N" channel device of FIG. 1, the biasing voltage on the gate would be a positive voltage. In a "P" type device, the biasing voltage would be a negative voltage.

For the purposes of this specification, the terminology "on biasing voltage" will be construed to means that voltage, whether positive or negative, which is sufficient to bias the gate such that current is conducted between the source and the drain. When current is conducted along the channel between the source and the drain, the MOSFET device of the invention will be considered to be turned "on", that is placed in an enabled or active state. Thus, in the illustrative embodiment of FIG. 1, when a positive on biasing voltage is imposed onto the gate 24, and the source and drain of the device 10 are connected to a circuit which includes a drain to source voltage, current will be conducted across the channel 20 between the source 16 and the drain 12.

From FIG. 1 it can be seen that the HEXFET device 10 includes multiple areas having two "N" type regions (drain 12 and source 14) separated by "P" type region 18. This configuration forms a general bipolar type of transistor structure and is an intrinsic "parasitic" type device which results from the vertical configuration of the HEXFET 10.

Figure 2:
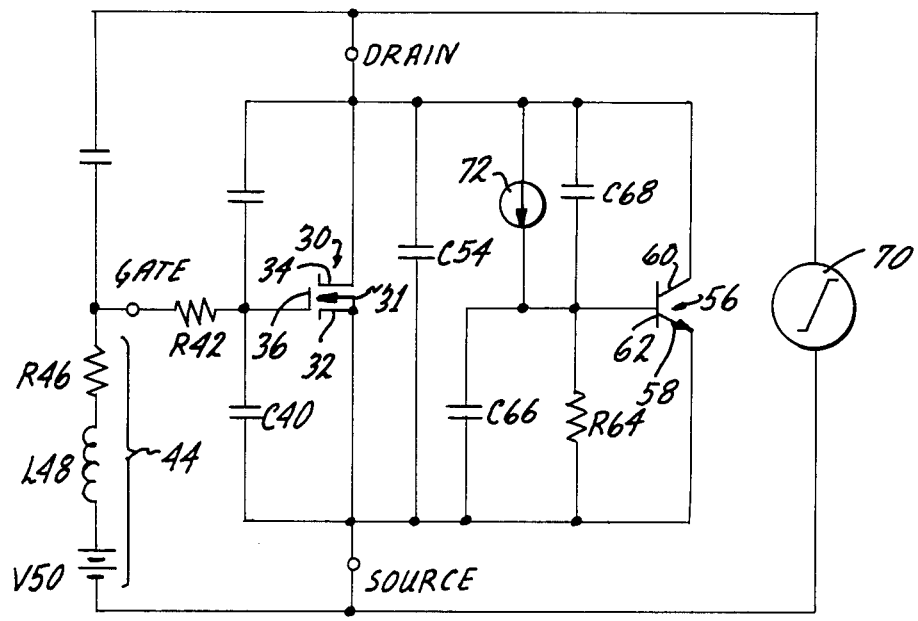
FIG. 2 is an electrical schematic of a MOSFET device and parasitic circuit elements inherent therein.
Figure 4:
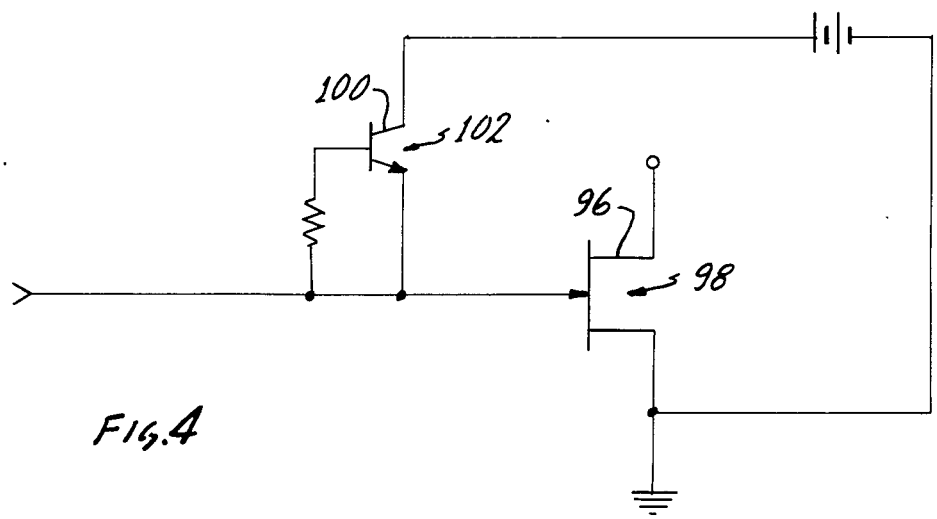
FIG. 4 is an electrical schematic of a further embodiment of the invention.

Referring now to FIG. 2, a schematic of an equivalent circuit for the device 10 during a radiation event is shown. The intrinsic MOSFET 30 (as indicated by its substrate 31) is an "N" channel type device. It includes a source 32, a drain 34 and a gate 36. The equivalent circuit includes a drain-gate capacitance 38, a source-gate capacitance 40, a gate resistance 42 and an external circuit impedance 44. The external impedance 44 includes a resistive component 46, an inductive component 38, and a voltage component 50. There is a further "stray" capacitance 52 and a drain-source capacitance 54. The intrinsic parasitic NPN bipolar transistor 56 includes an emitter 58, a collector 60 and a base 62. There is a distributed base resistance 64, a base-emitter capacitance 66 and a base-collector capacitance 68 within the parasitic transistor 56. The voltage source across the source and drain is shown at 70 and an induced photo current generator at 72.

Very high radiation fluxes of X-ray or gamma ray radiation of short duration or pulse are sometimes called "gams dot" radiation. For the purposes of this specification and the claims appended thereto, "gama dot" radiation will be referred to either as "a radiation event" or "radiation flux." The energy levels of this gamma dot type of radiation are typically substantially higher than the energy levels of the types of "low level" radiation discussed in the before mentioned U.S. Pat. Nos. 4,001,471 and 4,323,846 which causes changes in the gate insulating oxide of a MOSFET device.

While I do not wish to be bound by theory, it is my present belief that during a radiation even a large number of free charges are liberated in the device 10. During a radiation event, essentially all of the different types of semiconductor materials in a MOSFET device become conductors. The presence of the charges generated by the radiation event cause the above referred "parasitic" bipolar transistor within the device 10 (and other similar MOSFET type devices), to conduct what are called photo currents. During the radiation event, in FIG. 1, the large arrow 26 represents the radiation event induced photocurrents through the device 10. The arrows 28 represent radiation event induced transistor currents within t he device 10. As far as the MOSFET part of the device 10 is concerned, the photo current conduction is of little consequence and it recovers quickly after the cessation of the radiation event. The voltages imposed across the source and drain of the MOSFET device typically cause no damage since they are within the normal operation limits for the MOSFET device. However, the same is not true with respect to the parasitic bipolar transistor.

During the radiation event and under the influence of the voltage source 70 a large number of charges flow through the device 10 and result in the photo current 72. This current is primary limited in amplitude by the circuit impedance 78 external to the device 10. This current will flow until all of the radiation freed excess charges have recombined in the device 10. Because of the photo current generation 72 at the base junction of the parasitic bipolar transistor 56, the parasitic bipolar transistor 56 conducts a source-drain current from the voltage source 70 across its emitter 58 and collector 60. Upon the termination of the radiation event, the photo current 72 charge carriers recombine and the photo current 72 slowly diminishes as the charge carriers recombine.

The MOSFET portion of the device 10 is a majority carrier device and it therefore reaches equilibrium very fast at the cessation of the radiation event, much faster than the minority carrier parasitic bipolar transistor 56. If the MOSFET is biased "off", then current will continue to flow through the parasitic bipolar transistor 56 until all charges have recombined. During the recovery of the parasitic bipolar transistor 56, the transistor 56 enters a region of linear operation and the voltage from the voltage source 70 across the emitter 58 and collector 60 of the transistor 56 begins to rise while the collector current collapses.

As the voltage across the transistor 56 rises in concert with the collapse of the transistor 56 collector to emitter current, an energy peak within the parasitic bipolar transistor 56 initiates a "second breakdown" type failure mode which cause a power surge. The amplitude of the power surge is set by the voltage and currents obtained from the external circuit to which the device 10 is connected. The power surge apparently destroys the parasitic bipolar transistor 56 which, in turn, destroys the device 10. The power failure level of the parasitic bipolar transistor 56 is typically well below the peak power capabilities of the MOSFET device 10 during normal operations, that is operations not under the influence of the radiation event.

I have found that if the MOSFET device is simply turned "on" during the radiation event and maintained in an "on state" until after all of the charges have recombined and their resulting photo currents dissipated. The parasitic bipolar transistor inherent in the MOSFET device will be protected during the radiation event and the parasitic transistor recovery period by having the various currents resulting from the radiation event travel through the MOSFET part of the device 10 instead of the parasitic bipolar transistor itself. Under these conditions the MOSFET effectively shorts the parasitic transistor out and maintains a near zero voltage across it. This limits power surges in the parasitic bipolar transistor and protects the MOSFET device.

To implement the inventive method presented in the preceding paragraph I provide a simple circuit to operate the gate of the MOSFET in response to the radiation event. The circuit supplies an "on enabling voltage" to the gate of the MOSFET which turns the MOSFET "on" causing the MOSFET to effectively short out the parasitic bipolar transistor and protect this parasitic transistor from the destructive effects initiated by the radiation event.

Figure 3:
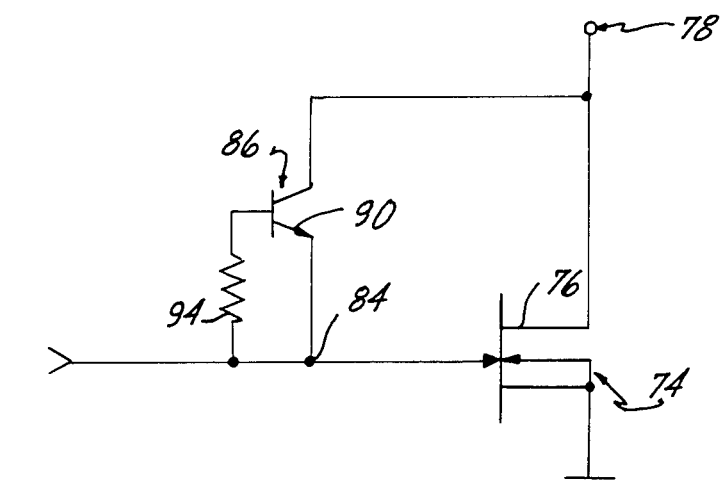
FIG. 3 is an electrical schematic of an embodiment of the invention.

FIG. 3 shows a first embodiment implementing my invention. A MOSFET 74, shown as a "N" channel type device, has it's source 76 connected to an external circuit at 78 which would include an appropriate voltage source (not shown or numbered) for driving the MOSFET 74 during its normal operation. The drain of the MOSFET 74 is connected to ground. The gate 84 of the MOSFET 74 is connected at junction 84.

An external (that is external to the MOSFET 74) bipolar transistor 86 (shown as a NPN transistor) has its collector connected to the voltage source at 78. The emitter 90 of the transistor 86 is connected to the junction 84. The base 92 of the transistor 86 connects to resistor 94 and the other lead of the resistor 94 is connected to the junction 84.

The external bipolar transistor 86 is preferably chosen such that it has approximately the same recovery time as does the MOSFET parasitic transistor. As with any transistor it can be viewed as a switch means. For use with a commercially available IRF350 type power MOSFET, the transistor 86 could be a 2N6480 type bipolar transistor available, for example, from RCA, Somerville, N. J.

The resistor 94 acts as a timing means for controlling the bipolar transistor 86. During the radiation event, photo currents are also generated in the external bipolar transistor 86. Once the radiation event has terminated, the rate of decay of the photo currents induced in the external bipolar transistor 86 are controlled by the resistor 94 such that the photo current decay in the parasitic transistor in the MOSFET 74 is essentially completed before the complete decay of the photo currents in the external bipolar transistor 86 occurs. This insures that the MOSFET is maintained in its "on" state, shorting the parasitic transistor within the MOSFET, until complete recovery of the parasitic transistor has occurred. Thus the gate of the MOSFET is maintained at or above its threshold voltage at least for a time period equal to the time period of the radiation event plus the decay time period of the photo currents in the parasitic bipolar transistor. For the devices of the previous paragraph, the resistor 94 may typically be chosen to have a resistance of about 10 ohms.

For use with P channel MOSFET devices and a PNP type of bipolar transistor would preferably be used and the polarities of the respective voltages and directions of the respective current in the circuits would be reversed.

For purposes of illustration of the invention, the present inventive radiation failure circumvention circuit has been illustrated with a bipolar transistor. It is, of course, recognized that other devices might also be used as long as they enable the gate of the MOSFET during the radiation event for a time sufficient to allow for nondestructive recovery of the parasitic bipolar transistor inherent in the MOSFET device.

In addition, for the purposes of illustration in this specification, the external transistor and the timing resistor have been shown as independent devices. It is, of course, recognized that these components or equivalent components could be included on an appropriate IC device or contained within the MOSFET device itself. This invention is especially useful for protecting power MOSFET devices since the circuit means does not degrade or interfere with the normal operation of the device.

I claim:

1. A radiation hardened electrical circuit which comprises:
   a MOSFET device having a gate, a source and a drain; said source being electrically connected to an electrical circuit, said electrical circuit including a voltage source;
   means for sensing a radiation event,
   means for imposing an "on" enabling bias voltage on said gate during a sensed radiation event so as to bias said MOSFET device in an ¢on" state at least during said radiation event, and
   timing means for maintaining said "on" enabling bias voltage imposed on said gate of said MOSFET device for a time period at least as long as said radiation event.

2. The circuit of claim 1 wherein:
   said means for imposing said enabling bias voltage comprises a switch means connecting between a biasing voltage source and said gate of said MOSFET device, said switch means for supplying the voltage bias of said biasing voltage source to said gate of said MOSFET device during said radiation event.

3. The circuit of claim 2 wherein:
   said switch means is connected between said external electrical circuit and said gate of said MOSFET device and said biasing voltage source comprises said voltage source in said external circuit.

4. the circuit of claim 1 wherein:
   said timing means is chosen so as to maintain said on enabling bias voltage imposed on said gate of said MOSFET device for a time period equal to the period of said radiation event plus a time period equal to a decay time of radiation event induced photo current within said MOSFET device.

5. The circuit of claim 1 wherein:
   said means for imposing said one enabling bias voltage comprises a bipolar transistor including on emitter, collector, and base.

6. The circuit of claim 5 wherein:
   the emitter and the collector of said bipolar transistor are connected in series with said gate of said MOSFET device and said external electrical circuit.

7. The circuit of claim 6 wherein:
   said base of said bipolar transistor is connected to said gate of said MOSFET device and further including a timing resistor positioned between said base and said emitter of said bipolar transistor.

8. The circuit of claim 1 wherein:
   said MOSFET device includes regions and an inherent parasitic transistor structure interconnected between said regions.

9. The circuit of claim 7 wherein:
   said MOSFET device includes regions and an inherent parasitic transistor structure interconnected between regions of said MOSFET device,
   said timing resistor is chosen such that upon the expiration of said radiation event, the recovery time of said bipolar transistor is at least as long as the recovery time of said parsitic transistor structure.

10. The circuit of claim 8 wherein:
    said MOSFET device is of a type including a vertical structure between at least two of said drain, said source or said gate of said MOSFET device.

11. The circuit of claim 1 wherein: said MOSFET device is a power MOSFET transistor.

12. The circuit of claim 8 wherein:
    said MOSFET device is an "N" channel type MOSFET transistor.

13. The circuit of claim 1 wherein:
    said MOSFET device is an "N" channel type MOSFET transistor.

14. The circuit of claim 13 wherein:
    said means for imposing said on enabling bias voltage comprises a bipolar transistor.

15. The circuit of claim 14 wherein:
    the emitter and the collector of said bipolar transistor are connected in series with the gate of said "N" channel type MOSFET device and said external electrical circuit.

16. The circuit of claim 15 wherein:
    said base of said bipolar transistor is connected to said gate of said "n" channel type MOSFET device and further including a timing resistor positioned between said base of said external bipolar transistor and said gate of said "N" channel type MOSFET device.

17. A radiation hardened MOSFET device having an inherent radiation induced parasitic transistor within said device, which comprises:
    a power MOSFET transistor device, said power MOSFET transistor device including a source, a drain and a gate;
    a bipolar transistor, said bipolar transistor including a collector, an emitter and a base;
    a timing resistor;
    one of said collector or said emitter of said bipolar transistor connected to said gate of said power MOSFET transistor device for supplying a threshold voltage to said gate of said power MOSFET transistor device;
    said timing resistor connected between said base of said bipolar transistor and said gate of said power MOSFET transistor device.

18. The device of claim 17 wherein:
    said power MOSFET transistor device is a vertically structured power MOSFET.

19. The device of claim 18 wherein:
    said vertically structured power MOSFET is a "N" channel power MOSFET device.

20. A process of circumventing radiation failure in a MOSFET device including a drain, source, and gate, said radiation having a duration, said processes comprising:
    connecting said MOSFET device to a voltage source for supplying an operating current to said MOSFET device;
    connecting a bipolar transistor means between the gate of said MOSFET device and a voltage source;
    maintaining said bipolar transistor means in a ready state such that in response to a radiation flux said radiation flux induces photo currents in said bipolar transistor means switching said bipolar transistor means to a conducting state wherein said bipolar transistor means supplies a voltage to said gate of said MOSFET transistor, said voltage supplied to said gate at least equal to the voltage necessary to turn "on" said MOSFET device whereby current flows between the source and the drain of said MOSFET device;
    maintaining said bipolar transistor means in said conducting state for a time period at least as long as the duration of said radiation to maintain said MOSFET device turned "on" for said time period.

21. The process of claim 20 further including:

associating a timing means with said bipolar transistor means for controlling the conducting state of said bipolar transistor means.

22. The process of claim 21 wherein said timing means includes a resistor means.

23. The process of claim 22 including:
   selecting said bipolar transistor means to include a base and emitter terminal;
   positioning said resistor means between said base terminal and said emitter terminal of said bipolar transistor.

24. A method of circumventing radiation failure in a MOSFET device having inherent parasitic elements having the property that, after a radiation exposure disabling their operation they recover operation after a predetermined recovery time, comprising:
   turning on said MOSFET during an exposure to radiation; and
   keeping the MOSFET on after the radiation exposure for at least the recovery time of said parasitic elements.

25. A radiation hardened electrical circuit which comprises:
   a MOSFET device having a gate, a source, and a drain; said source being electrically connected to an electrical circuit, said electrical circuit including a voltage source,
   means for sensing a radiation event,
   means for imposing an "on" enabling bias voltage on said gate during a sensed radiation event so as to bias said MOSFET device in an "on" state at least during said radiation event,
   said means for imposing said enabling bias voltage comprises a switch means connecting between a biasing voltage source and said gate of said MOSFET device, said switch means for supplying the voltage bias of said biasing voltage source to said gate of said MOSFET device during said radiation event,
   timing means for maintaining said on enabling bias voltage imposed on said gate of said MOSFET device for a time period equal to the period of said radiation event plus a time period equal to a decay time of the radiation event induced photo current within said MOSFET device.

* * * * *